United States Patent [19]

Hesterman

[11] Patent Number: 4,843,316
[45] Date of Patent: Jun. 27, 1989

[54] NONDESTRUCTIVE M-H HYSTERESIS TESTERS FOR MAGNETIC DISCS FOR COMPUTER DISC DRIVES

[75] Inventor: Victor W. Hesterman, Los Altos Hills, Calif.

[73] Assignee: Hewlett-Packard Company, Palo Alto, Calif.

[21] Appl. No.: 144,690

[22] Filed: Jan. 13, 1988

Related U.S. Application Data

[63] Continuation of Ser. No. 879,670, Jun. 27, 1986, abandoned.

[51] Int. Cl.$^4$ ............... G01R 33/14; G01R 35/00; G01N 27/72
[52] U.S. Cl. .................... 324/210; 324/202; 324/212; 324/223; 324/225
[58] Field of Search ........ 324/202, 207, 208, 210–212, 324/222, 223, 225, 228–234, 238–243

[56] References Cited

U.S. PATENT DOCUMENTS

| | | | |
|---|---|---|---|
| 2,065,119 | 12/1936 | Davis | 324/241 |
| 3,365,660 | 1/1968 | Steingroever | 324/223 X |
| 3,440,527 | 4/1969 | Steingroever | 324/230 |
| 3,534,253 | 10/1970 | Zinke | 324/239 |
| 3,535,625 | 10/1970 | Pratt | 324/233 |
| 3,611,120 | 10/1971 | Forster | 324/225 |
| 3,626,344 | 12/1971 | Shaternikov et al. | 324/230 X |
| 4,314,202 | 2/1982 | Okubo | 324/207 |
| 4,658,148 | 4/1987 | Naito | 324/212 X |

FOREIGN PATENT DOCUMENTS

| | | | |
|---|---|---|---|
| 2832045 | 3/1979 | Fed. Rep. of Germany | 324/235 |
| 716410 | 12/1931 | France | 324/228 |
| 0045953 | 12/1977 | Japan | 324/207 |
| 0892387 | 12/1981 | U.S.S.R. | 324/223 |
| 995036 | 2/1983 | U.S.S.R. | 324/228 |
| 1188521 | 10/1985 | U.S.S.R. | 324/229 |

OTHER PUBLICATIONS

Hoel, J. E. Magnetic Reluctance, Film Thickness Gauge, IBM Tech. Discl. Bull. vol. 13, No. 10, Mar. 1971, pp. 3048–3049.

*Primary Examiner*—Gerard R. Strecker
*Attorney, Agent, or Firm*—William H. F. Howard; Saundra H. Hand

[57] ABSTRACT

The manufacture of digital magnetic recording discs for computer disc drives requires the monitoring and control of the M-H hysteresis loop properties of the magnetic film deposited on the disc substrate. Several methods exist for measuring this M-H hysteresis loop, but they all have serious disadvantages. One method consists of cutting samples and measuring them with a vibrating sample magnetometer. This is a destructive test and requires a lot of time per sample. Another method uses the Kerr-rotation of polarized light. However, it samples only the mangetization of the surface and cannot determine the magnetic thickness of the film. A third method magnetizes the entire disc and samples a large region along a diameter. This method cannot distinguish between the top and bottom films of the disc, and cannot resolve circumferential variations of th M-H loop properties. The method of this invention solves these problems by measuring a small part of one surface of the disc nondestructively using a special balanced head having two air gaps. It is fast, requiring only about 2 minutes per measurement and has good reproducability.

5 Claims, 3 Drawing Sheets

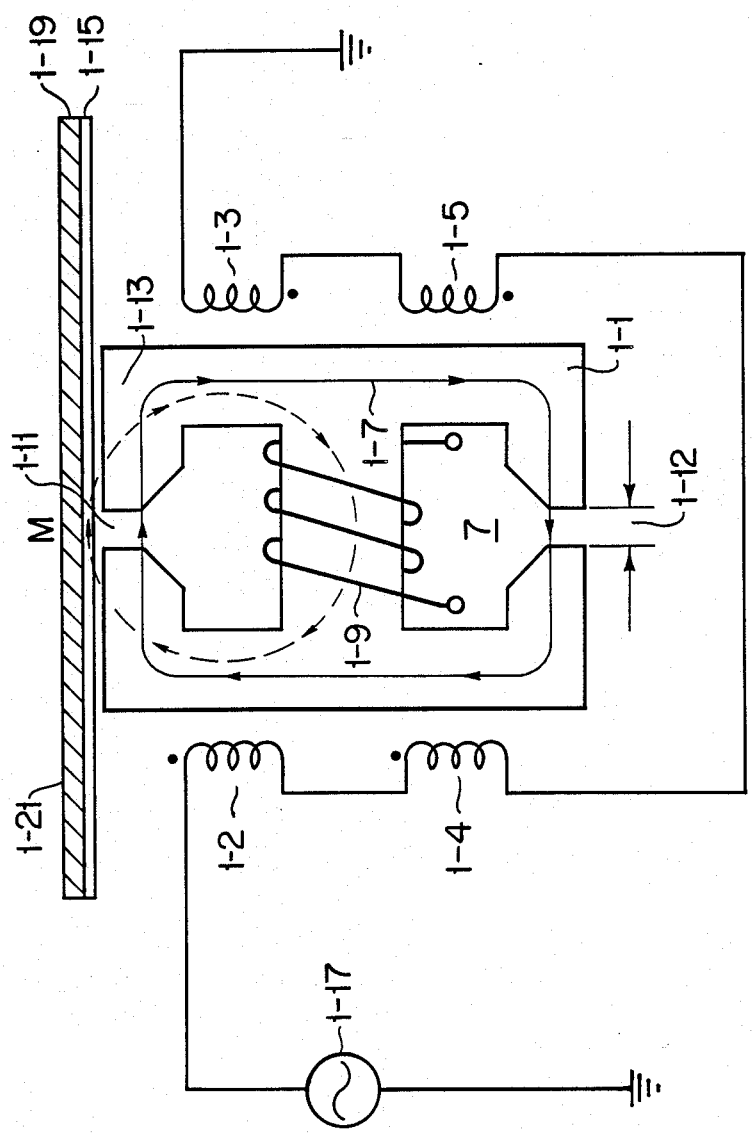

NONDESTRUCTIVE M-H HYSTERESIS TESTERS FOR MAGNETIC DISCS FOR COMPUTER DISC DRIVES

This application is a continuation, of application Ser. No. 879,670, filed June 27, 1986, now abandoned.

FIELD OF THE INVENTION

The invention is a device for testing magnetic storage media for computers. Specifically, the invention tests the magnetic properties of discs used in computer disc drives.

BACKGROUND OF THE INVENTION

In this application, an item number's highest order digit identifies the figure. The lower order digits identify the item.

FIG. 3 shows an M-H hysteresis loop of a computer disc. $H_c$ 3-33, the coercivity, represents the strength of the applied magnetic field required to switch the magnetization, M, of the disc from a negative polarity to a positive polarity. Likewise, $-H_c$ 3-37, represents the strength of the applied magnetic field where the magnetic field, M, of the disc switches from a positive polarity to a negative polarity. Thus, when writing to a disc the applied magnetic field, H, must exceed $H_c$ to change the polarity of the magnetization from negative to positive or be less than $H_c$ 3-37 to change the polarity of the magnetic field from positive to negative. When reading the discs, the read head detects the magnetization, M, of the disc. The magnitude of the magnetization will be $M_r$ 3-31 or $M_{-r}$ 3-35. Thus, the M-H hysteresis loop properties of the discs must be carefully controlled in the manufacturing procedure.

The most common prior art technique for measuring the M-H hystersis loop property of computer discs requires samples to be cut or punched from the disc. Then, a vibrating sample magnetometer measures the M-H hysteresis loop properties of the sample. This technique has several disadvantages. The cutting or punching process may distort the sample and thereby change the magnetic property being measured because of magnetostriction. Ferromagnetic contamination on the edges of the sample created by the cutting or punching process contributes additional error to measurements of the M-H hysteresis loop. Furthermore, the prior art test methods consume time. The cutting of each sample may require fifteen minutes or more. Additionally, the measurement of the M-H hystersis loop properties in a vibrating sample magnetometer (VSM) usually requires from 20 to 40 minutes per sample. Worst of all this testing method destroys the disc so it can no longer be used for other tests.

There have been several attempts to improve the accuracy and speed of M-H hystersis loop testers. One scheme cuts samples very carefully to minimize distortion of its magnetic properties. Another scheme uses a diamond tip or a tungsten carbide cutting edge to prevent steel or ferromagnetic material from contacting the sample and contaminating it. Another scheme reduces the number of samples tested and the time required for testing. However, reducing the number of test samples sacrifices the quality of the tests.

The disadvantages of destroying the disc are partially offset by conducting the M-H looper test last. However, if the need for further testing becomes apparent, the destruction of the disc makes their execution impossible.

The LDJ Co. of Michigan sells an M-H hystersis loop tester that measures the M-H hysteresis loop of a large part of the disc nondestructively. This device tests large portions of the disc at once by applying a magnetic field to the entire disc. Then it measures the resulting magnetization change in a large part of the disc which includes both sides of the disc along its diameter. Testing large portions of the disc at once produces inaccurate results. Some parts of the tested region are magnetized in a circumferential direction and other parts in a radial direction. The magnetic properties may be different in these two directions. In addition, this method does not measure variations in the M-H hysteresis loop around the circumference of the disc. These measurements are necessary to test the uniformity of the manufacturing process.

Quad Group Inc. sells an M-H hysteresis loop tester that measures the M-H hysteresis loop characteristics of the surface of the magnetic film by using the Kerr effect. It cannot detect the additional magnetization below the surface of a magnetic film coating. Therefore, this M-H hysteresis loop tester cannot determine the magnetization x thickness product, which is important to control in a manufacturing process. The other types of instruments listed above, including this invention, actually measures the magnetization x thickness product. This invention, however, cannot at its present stage of development, accurately measure the squareness, $M_r/M_s$. Although this is an important parameter, it does not typically vary much for a given manufacturing process on a day-to-day basis.

SUMMARY OF THE INVENTION

The present invention has several advantages. It is an apparatus and method for accurately measuring the M-H hysteresis loop properties, especially $M_r$ and $H_c$, of a disc without destroying the disc. The testing of entire discs instead of samples cut from the disc eliminates inaccuracies caused by cutting. Also, the elimination of cut samples reduces the time required to measure the M-H hysteresis loop. Also, the invention permits easy and quick measurements of variations in the M-H hysteresis loop around the circumference of the disc.

Therefore an object of the invention is to accurately measure the M-H hysteresis loop properties of a disc without damaging the disc.

Another object of the invention is to accurately measure the M-H hysteresis loop property of a disc around the circumference of the disc.

The invention is an apparatus and a method for accurately measuring the M-H hysteresis loop properties of a disc. The apparatus has a magnetic core and several balanced drive coils to produce a large drive magnetic field to magnetize the sample. A sense coil located in the center of the magnetic core produces a voltage signal proportional to the rate of change of magnetic flux passing through it. As shown by the equation $V = N_2 d\Phi/dt$ where $N_2$ is the number of turns in the sense winding 1-9 and $d\Phi/dt$ is the time rate of change in magnetic flux. The components of drive magnetic flux cancel each other out in the center leg of the magnetic core. Thus, the sense coil does not detect them. The symmetrical magnetic core contains two gaps with identical characteristics. The disc under test is placed adjacent to one gap. A change in magnetization of the disc changes the magnetic flux in the center leg of the magnetic core. A sense coil located on the center leg of the magnetic core detects the magnetic flux change produced by the sample. The signal produced by the sense coil is given by $V = N_2 d\Phi/dt$.

The method for carrying out the measurements calibrates the apparatus so that it is not sensitive to eddy currents in the disc substrate or to small imbalances in the air gaps or top and bottom parts of the core.

BRIEF DESCRIPTION OF THE DRAWINGS

FIG. 1 is the preferred embodiment of the invention.

DETAILED DESCRIPTION OF A PREFERRED EXAMPLE EMBODIMENT

Structure

Figure 3:
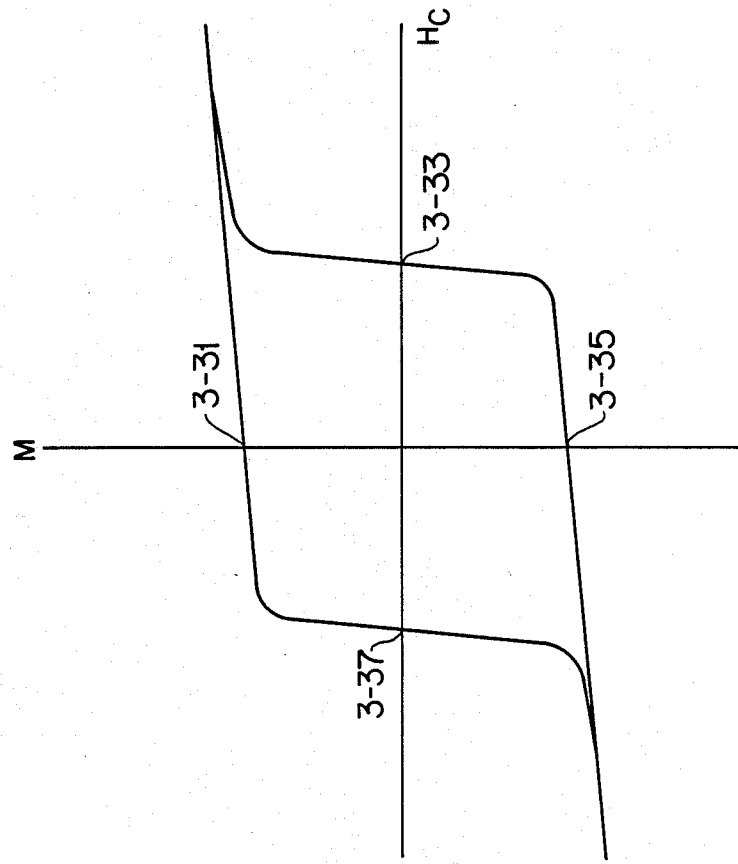
FIG. 3 is an M-H hysteresis loop of a typical disc measured by the apparatus in FIG. 1.
Figure 2:
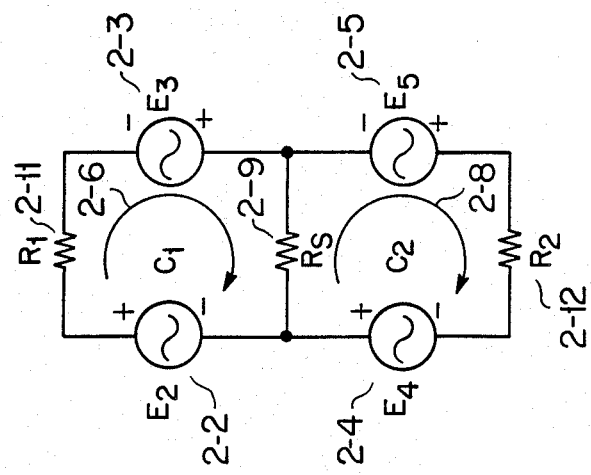
FIG. 2 is an electrical analog equivalent circuit of the preferred embodiment of the invention shown in FIG. 1.

FIG. 1 shows the preferred embodiment of the invention. The magnetic core 1-1 and the drive coils mechanisms 1-2, 1-3, 1-4 and 1-5 form an electromagnet which produces a large drive magnetic field of about 120,000 At/M (1500 Oersteds) to magnetize the magnetic film on the disc 1-15. Note: FIG. 1 shows the drive coil mechanism 1-2, 1-3, 1-4, 1-5 schematically. In actual practice the individual coils 1-2, 1-3, 1-4 and 1-5 are wrapped around the magnetic core 1-1. The equation $H = KN_1I$ describes the magnetic field in the gaps produced by the coils 1-2, 1-3, 1-4 and 1-5. Where K is a constant, $N_1$ is the number of turns of wire in each drive coil, and I is the current through the coils 1-2, 1-3, 1-4 and 1-5. To produce the drive magnetic field, the current in the coils 1-2, 1-3, 1-4 and 1-5 ranges from 0 to 0.5 amps. The magnet core 1-1 is constructed from ferrite or permalloy material with a high remanent magnetization, $M_r$, low coercivity, $H_c$, and low magnetostriction. If the amp-turns, NI, of each drive coil 1-2, 1-3, 1-4 and 1-5 are identical, and the ratio of (gap length/gap area) is the same for each gap 1-11, 1-12, and the core is symmetrical top to bottom, and if the drive coils 1-2, 1-3, 1-4 and 1-5 are placed symmetrically around the magnetic core 1-1, then the large drive flux 1-7 passes around the periphery of the magnet 1-1 and not through the sense coil 1-9 as shown in FIG. 1. FIG. 2 further illustrates this principal.

FIG. 2 is an analog electrical equivalent circuit of the apparatus shown in FIG. 1. The ac electric generator $E_2$ 2-2 represents the amp-turns of coil 1-2. Likewise, the other generators $E_3$ 2-3, $E_4$ 2-4, and $E_5$ 2-5 represent the amp-turns of coils 1-3, 1-4, and 1-5. The resistor $R_1$ 2-11 represents the magnetic reluctance of the top air gap 1-11 plus the reluctance of the top part of the core and the bottom resistor $R_2$ 2-12 represents the reluctance of the bottom air gap 2-12 plus the reluctance of the bottom part of the core. $R_s$ 2-9 represents the reluctance of the center leg of the core where the sense coil 1-9 is wound. The generators 2-2, 2-3, 2-4 and 2-5 are in phase. If $E_2 = E_3 = E_4 = E_5$ and $R_1 = R_2$, the mesh current 2-6 and the mesh current 2-8 are equal. In $R_s$ 2-9, the currents 2-6 and 2-8 have the same magnitude and the opposite polarity. Therefore, they cancel out. Provided the coils 1-2, 1-3, 1-4, and 1-5 are symmetrically placed, the coils produce the same drive field, the core is symmetrical top-to-bottom, and the gaps 1-11, 1-12 have the same reluctance, the magnetic flux produced by coils 1-2 and 1-3 will have the same magnitude as the magnetic flux produced by coils 1-4 and 1-5. In the sense coil 1-9, the magnetic flux produced by the top two coils 1-2, 1-3 will have the same magnitude but opposite polarity from the magnetic flux produced by the bottom two coils 1-4, 1-5. Therefore, the magnetic flux from the top two coils 1-2, 1-3 and the magnetic flux from the bottom two coils 1-4, 1-5 will cancel each other out in the center leg.

Operation

A sample disc 1-21 is placed near one of the two air gaps 1-11 of the magnet core 1-1. The magnetic thin film 1-15 becomes magnetized by the drive magnetic field 1-7 in the gap 1-11. An unbalance in the magnetic flux through the sense coil 1-9 results. The changing magnetic flux 1-13 produced by the magnetization in the magnetic thin film 1-15 of the sample disc 1-21 passes through the sense coil 1-9 and induces a voltage in it. This voltage is proportional to $d\Phi_2/dt$ where $\Phi_2$ equals the magnetic flux through the sense coil 1-9. The equation describing this phenomenon is:

$$V = N_2 d\Phi_2/dt.$$

The voltage signal produced by sense coil 1-9 is amplified with a special low noise differential amplifier, and integrated to become proportional to the total magnetic flux change through the sense coil and also proportional to the change in magnetization, $\Delta M$, of the sample disc 1-21. The change in magnetization, $\Delta M$, of the sample thin film 1-15 can be derived from the voltage of the sense coil 1-9 through the following series of equations, that use the SI system of units.

$$V = N_2 d\Phi_2/dt$$

$$\int V dt = N_2(\Delta \Phi_2)$$

$$\Delta \Phi_2 k(\Delta \Phi_1)$$

$$\Delta \Phi_1 = \int \Delta B \cdot dA = (\Delta B)A; \text{ if B is uniform over area A}$$

$$\Delta B = \mu_o(\Delta M + H)$$

$$\int V dt = N_2 K(\Delta B)A = N_2 A \mu_o(\Delta M + H)$$

$$M = (\int V dt / \mu_o K A N_2) - H$$

H is the magnetic field applied to the sample disc 1-21 by the coils 1-2, 1-3, 1-4, and 1-5 and the magnetic core 1-1. The magnetization change, $\Delta M$, and $\Delta \Phi_1$ of the magnetic film 1-15 results from applying the magnetic field H to the same magnetic film 1-15, and varies according to the thin film material 1-15 used and the way it is processed in manufacture. And A is the cross section area of the sample leg of the magnetic core 1-1. A digital computer does the necessary integration and solves the equations to obtain $\Delta M$ the magnetization change of the sample thin film of disc 1-21.

A digital computer controls the placement of the sample disc 1-21, subtracts out eddy currents, subtracts out errors due to unbalance of the magnetic core 1-1, and plots the resulting M-H hysteresis loop. The computer shifts the hysteresis loop along the M axis so the origin is in the center of the loop. This converts $\Delta M$ to M.

The eddy currents in the aluminum substrate 1-19 of the sample disc 1-21 produce an unwanted magnetic signal that must be eliminated. The eddy current's amplitude is proportional to the drive frequency produced by the drive coils 1-2, 1-3, 1-4 and 1-5. Therefore, drive signals 1-7 frequency is only 0.5 Hz. in the preferred embodiment of the invention. Even with such a low frequency drive signal 1-7, the eddy current amplitude is typically twice the amplitude of the magnetic signal from the magnetic layer 1-15 of the the sample disc 1-21. The magnetic signal produced by the eddy currents in the substrate 1-19 are calibrated out of the magnetic signal 1-13 which also includes the magnetic signals from the magnetic layer 1-15 of the sample disc 1-21. The calibration procedure uses a dummy disc identical to the sample disc 1-21 except that it does not have a magnetic film. The dummy disc is placed in the testing position and the resulting magnetic signal is measured. The calibration procedure subtracts the dummy disc magnetic signal from the magnetic signal 1-13 emanating from sample discs 1-21 with a magnetic layer 1-15. This subtraction process also subtracts out the H term in last equation above. The dummy disc measurement is done both before and after the sample measurement and the average of the before and after signals are subtracted. This removes errors due to the linear drifting of the balance.

If the electrical resistivity of dummy disc's substrate differs from the the sample disc's substrate 1-19, then the dummy disc's eddy current signal will differ substantially from the sample disc 1-21 substrate's eddy current signal. In this case, an additional procedure eliminates the eddy current's contributions to the magnetic signal 1-13 of the sample disc 1-21. This procedure reduces the amplitude of the drive signal 1-7 so the peak value of the applied magnetic field, H, is well below the coercivity, $H_c$, of the magnet layer 1-15 of the sample disc 1-21. The resulting eddy current signal imbalance between the sample and the dummy is measured. A computer use this measurement to obtain a correction term for the subsequent M-H hysteresis loop measurements.

The calibration of the M axis of the M-H hysteresis loop must include the effects of the fringing magnetic fields. These unwanted fringe fields are the magnetic fields that are not directly over the gap 1-11, but are in the near vicinity of the gap. These fringe fields are smaller than the field directly over the gap, and therefore partially switch some extra magnetization of the sample film. This contributes a small error term that must be calibrated out. The size of this error term depends upon the coercivity $H_c$ of the sample. If $H_c$ is low, then the fringe field switches more of the sample thin film 1-15. Conversely, if $H_c$ is high, the fringe field switches less of the sample. This error term can be removed by calibrating with two or more standard discs having different $H_c$ values. Then a calibrating factor that depends linearly upon $H_c$, can be determined and this factor used by the computer to plot each M, H data point on the hysteresis loop.

The successful implementation of the invention depends upon the correct choice of several design parameters. The dimensions of the air gaps 1-11, 1-12 must be carefully chosen. The ratio of the length of each gap 1-11, 1-12 and the cross-sectional area of the magnetic core 1-1 at the gaps 1-11, 1-12 must be very nearly equal. The imbalance of the air gaps 1-11 and 1-12, is described as the difference between the ratios for each gap divided by the ratio of one of the gaps:

$$\text{Imbalance} = \frac{\frac{\text{gap 1-11 length}}{\text{gap 1-11 area}} - \frac{\text{gap 1-12 length}}{\text{gap 1-12 area}}}{\frac{\text{gap 1-11 length}}{\text{gap 1-12 area}}} < 10^{-6},$$

This imbalance must be very small, roughly 1 part in 1 million or less. In order to meet these stringent requirements, a very stable clamping arrangement has been devised. The clamps have a fiberglass frame with fine adjustment screws. The screws are tightened or loosened to alter the length of the gaps 1-11 and 1-12.

It is also important that the top and bottom parts are made of the same block of material so the temperature will tend to be the same top-to-bottom. If two separate magnetic cores 1-1 are used, one for top gas 1-11 and one for bottom gap 1-12, there would be temperature differences between the two cores 1-1. A temperature difference would introduce errors into the sense coil 1-19 readings.

Figure 4:
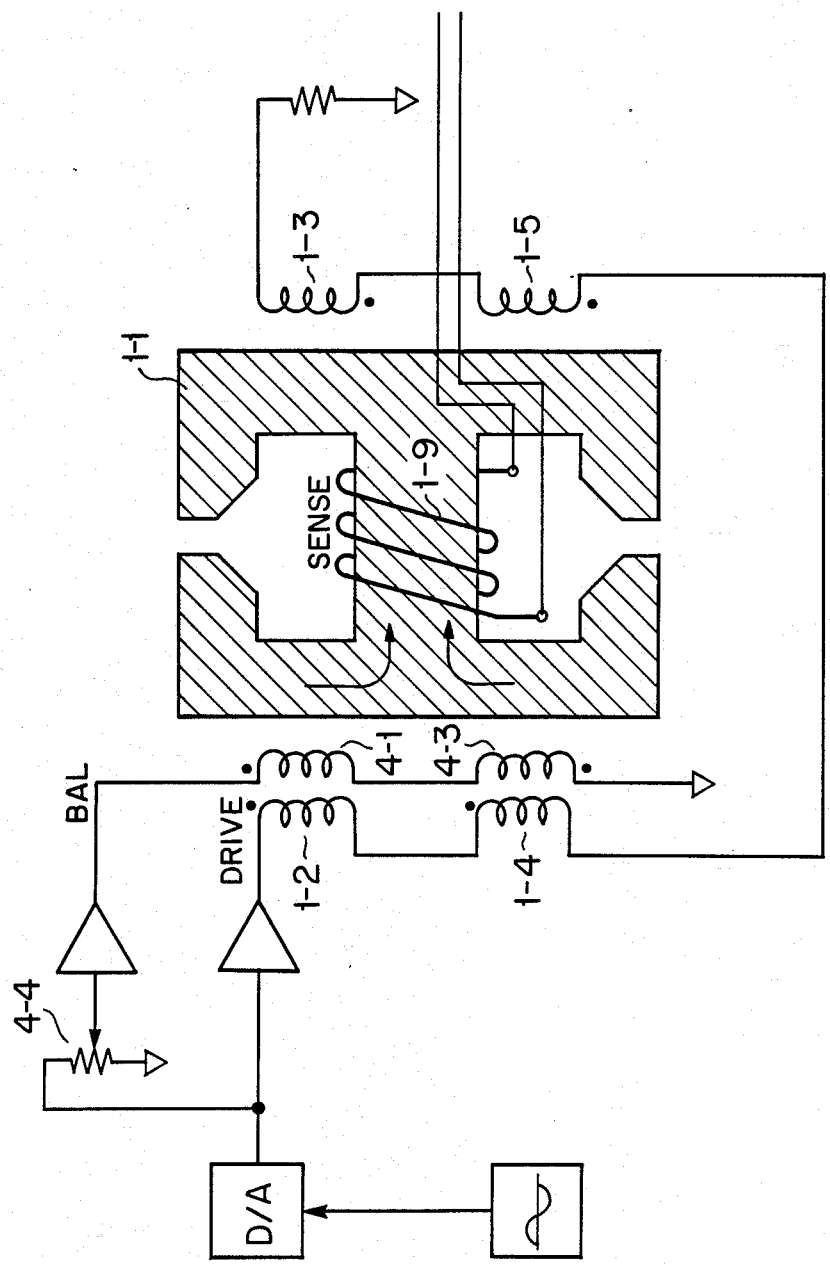
FIG. 4 shows the electronic balance circuitry.

The electronic balance circuity shown in FIG. 4 achieves further precision in the balance equation. The electronic balance circuitry adjusts the magnetic flux in the magnetic core 1-1 so that the total magnetic flux through the sense coil 1-9 is very nearly zero when a sample disc 1-21 is not being treated. The balance circuitry contains balance coils 4-1 and 4-3. Balance coils 4-1, 4-3 are wound in opposite directions so that the magnetic flux created by these coils has the same polarity in the center arm of the magnetic core 1-1 upon which the sense coil 1-9 is wound. The voltage of the sense coils 1-9 is measured without a sample disc 1-21 in place. If a voltage is detected, the signal through the balance coils 4-1 and 4-3 is adjusted by means of attenuator 4-4 to eliminate the voltage at the sense coil 1-9 outputs. Further precision in the balance is obtained by using the computer to subtract the remaining unbalance from the test results. Thus, the effect of the imbalance of air gaps 1-11 and 1-12 is corrected out, so that the imbalance is less than $1 \times 10^{-6}$.

I claim:
1. An apparatus for measuring the M-H magnetic hysteresis loop characteristics of a magnetic data storage disc under test including a substrate and a magnetic film layer mounted to the substrate, where M is a magnetization characteristic of the magnetic film and H is a magnetic field intensity characteristic of a magnetic field inducing the magnetization M of the magnetic film, the apparatus comprising:
  a. a generator means,
    i. for generating and applying a magnetic field having a known intensity H to a magnetic disc to be characterized,
    ii. positioned close enough to the disc so that the generated magnetic field H induces a desired magnetization M in the disc, the magnetization including
      (1) a desired component induced in the magnetic film, and
      (2) an undesired component in the form of a plurality of eddy currents induced in the substrate, the eddy currents in turn inducing undesirable eddy magnetic fields that interefere with a correct determination of M;
  b. a sensor means
    i. for determining the magnetization M of the magnetic film alone, ii. including a cancelling means for removing the effects of the eddy magnetic fields,
iii. positioned to magnetically interact with the magnetic field associated with the magnetization of the magnetic film, and
iv. magnetically isolated from interacting with the magnetic field produced by the generator means;
c. a regulating means, coupled for varying the applied magnetic field intensity H generated by the generator means, the generator means, the sensor means and the regulator means thereby cooperating to determine the M-H data points in sufficient number to define the hysteresis loop associated with the particular magnetic disc under test, thereby characterizing the M and the H characteristics of the disc.

2. The apparatus defined in claim 1, wherein the generator means comprises:
a. a magnetic core,
i. formed with a top section and a bottom section which are symmetrical with respect to each other,
ii. the top section being positioned adjacent the magnetic disc and the bottom section being positioned away from the magnetic disc, and
iii. provided with a coupling member for coupling the top section and the bottom section symmetrically with respect to each other around the coupling member;
b. a first gap,
i. located in a top region of the center top of the top section,
ii. characterized by a first gap length and a first gap area which in cross-section is identical to the cross-sectional area of the top section in which the first gap is located;
c. a second gap,
i. located in a bottom region of the center bottom of the bottom section,
ii. characterized by a second gap length and a second gap area which in cross-section is identical to the cross-sectional area of the bottom section in which the second gap is located, and
iii. substantially identical to the first gap in the sense that the ratio of the respective gap lengths to the respective gap areas (i.e., gap length:gap area, or gap length/gap area) is identical for the first gap and the second gap, and
d. at least four elecromagnetic coils,
i. including a first coil, a second coil, a third coil and a fourth coil,
ii. symmetrically positioned with respect to one another and with respect to the magnetic core,
iii. coupled to magnetically interact with the magnetic core,
iv. each coil having the same number of amp-turns NxI.

3. The apparatus defined in claim 2, wherein the sensor means for determining the magnetizatin M comprises:
a. a sense coil,
i. wound around the symmetrical center of the magnetic core,
ii. formed to detect the magnetization M signal emerging from the magnetic disc, and in response generate an electric signal; and
b. a shielding means, formed for magnetically isolating the sense coil so that the sense coil only detects the magnetization M signal emerging from the magnetic disc.

4. The apparatus defined in claim 3, wherein the regulating means for varying the applied magnetic field intensity comprises: a current means,
a. coupled electrically in series with each of the four electromagnetic coils, and
b. formed for deliverying an alternating current having a varying amplitude.

5. The apparatus defined in claim 4, further including a balance circuit, coupled for adjusting the magnetic flux generated in the magnetic core so the total magnetic flux can be selectively adjusted to substantially equal zero, thereby achieving a balanced magnetic core operation as measured by a zero output signal emering from the sense coil, the balance circuit comprising:
a. a first balancing coil,
i. coupled through a first winding for delivering a first balancing flux to the magnetic core,
ii. the first winding being wound in a first direction around the magnetic core;
b. a second balancing coil,
i. connected in series with the first balancing coil,
ii. coupled through a second winding for delivering a second balancing flux to the magnetic core,
iii. the second winding being wound in a second direction around the magnetic core,
iv. the second winding being wound around the magnetic core in a direction opposite to the direction of the first winding; and
c. an attenuator means,
i. connected in series to the first balancing coil and the second balancing coil,
ii. formed for balancing the first balancing flux and the second balancing flux,
whereby the sensor coil generates a zero output signal.

* * * * *